US007049860B2

(12) United States Patent
Gupta (10) Patent No.: US 7,049,860 B2
(45) Date of Patent: *May 23, 2006

(54) METHOD AND CIRCUIT FOR CONTROLLING A RESISTANCE OF A FIELD EFFECT TRANSISTOR CONFIGURED TO CONDUCT A SIGNAL WITH A VARYING VOLTAGE

(75) Inventor: Sandeep K. Gupta, Mountain View, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/066,254

(22) Filed: Feb. 28, 2005

(65) Prior Publication Data

US 2005/0140397 A1    Jun. 30, 2005

Related U.S. Application Data

(60) Continuation of application No. 10/782,978, filed on Feb. 23, 2004, now Pat. No. 6,861,879, which is a division of application No. 09/911,498, filed on Jul. 25, 2001, now Pat. No. 6,720,799.

(60) Provisional application No. 60/260,924, filed on Jan. 11, 2001.

(51) Int. Cl.
*G11C 27/02* (2006.01)

(52) U.S. Cl. .......................................... 327/92; 327/337

(58) Field of Classification Search ................ 327/427, 327/494, 554, 588, 423, 424, 317–319, 336, 327/337, 2, 3, 12, 161, 162, 163, 200, 201, 327/202, 225, 564, 565; 365/191, 194, 233
See application file for complete search history.

(56) References Cited

U.S. PATENT DOCUMENTS 4,229,692 A    10/1980    Graeme ........................ 324/62

(Continued)

FOREIGN PATENT DOCUMENTS

| FR | 2 793 970 | 11/2000 |
| WO | WO 94/01936 | 1/1994 |
| WO | WO 00/79682 A1 | 12/2000 |

OTHER PUBLICATIONS

*Low-voltage, High-Speed, High-Precision Switched-capacitor Circuits: Slide 5 of 25*, from http://kabuki.eecs.berkeley.edu/~abo/slides/quals/quals.5.html, 1 page (Apr. 25, 1996).

(Continued)

*Primary Examiner*—Timothy P. Callahan
*Assistant Examiner*—Hai L. Nguyen
(74) *Attorney, Agent, or Firm*—Sterne, Kessler, Goldstein & Fox P.L.L.C.

(57) ABSTRACT

The present invention relates to a replica network for linearizing switched capacitor circuits. A bridge circuit with a MOSFET resistor disposed in a resistor branch of the bridge circuit is provided. A noninverting terminal of an operational amplifier is connected to a first node of the bridge circuit and an inverting terminal of the operational amplifier is connected to a second node of the bridge circuit. The second node is separated from the first node by another node of the bridge circuit. An output of the operational amplifier is provided to a gate terminal of the MOSFET resistor and to the gate terminal of the MOSFET switch in a switched capacitor circuit, thereby controlling the resistance of the MOSFET switch so that it is independent of the signal voltage. In this manner, the replica network of the present invention linearizes the switched capacitor circuit. In this manner, the replica network of the present invention linearizes the switched capacitor circuit.

21 Claims, 4 Drawing Sheets

U.S. PATENT DOCUMENTS

| | | | | |
|---|---|---|---|---|
| 5,159,277 | A | 10/1992 | Mount | 324/721 |
| 5,243,235 | A | 9/1993 | Wakayama et al. | 327/92 |
| 5,572,154 | A | 11/1996 | Rakers et al. | 327/92 |
| 5,608,614 | A | 3/1997 | Ohnishi et al. | 363/60 |
| 5,689,201 | A | 11/1997 | Temes et al. | 327/95 |
| 5,698,999 | A | 12/1997 | Etoh et al. | 327/94 |
| 5,726,564 | A * | 3/1998 | Takashima | 323/367 |
| 5,736,890 | A * | 4/1998 | Yee et al. | 327/423 |
| 5,736,895 | A | 4/1998 | Yu et al. | 327/554 |
| 5,745,002 | A | 4/1998 | Baschirotto et al. | 327/554 |
| 5,753,815 | A | 5/1998 | Murata | 73/204.15 |
| 5,796,286 | A * | 8/1998 | Otaka | 327/308 |
| 5,838,175 | A | 11/1998 | Hsieh | 327/94 |
| 5,892,473 | A | 4/1999 | Shin | 341/150 |
| 5,960,183 | A | 9/1999 | Toumazou et al. | 395/500.04 |
| 5,963,156 | A | 10/1999 | Lewicki et al. | 341/122 |
| 6,031,399 | A | 2/2000 | Vu et al. | 327/96 |
| 6,127,877 | A * | 10/2000 | Gabara | 327/362 |
| 6,137,321 | A | 10/2000 | Bazarjani | 327/96 |
| 6,147,312 | A * | 11/2000 | Lockery | 177/211 |
| 6,150,971 | A | 11/2000 | Naylor et al. | 341/154 |
| 6,198,296 | B1 | 3/2001 | Ivanov | 324/725 |
| 6,313,687 | B1 * | 11/2001 | Banu | 327/317 |
| 6,344,767 | B1 | 2/2002 | Cheung et al. | 327/336 |
| 6,437,720 | B1 | 8/2002 | Yin et al. | 341/150 |
| 6,538,502 | B1 | 3/2003 | Nair et al. | 330/9 |
| 6,636,084 | B1 | 10/2003 | Sarraj | 327/95 |
| 6,720,799 | B1 | 4/2004 | Gupta | 327/92 |
| 6,861,879 | B1 * | 3/2005 | Gupta | 327/92 |

OTHER PUBLICATIONS

*Low-voltage, High-Speed, High-Precision Switched-capacitor Circuits: Slide 8 of 25*, from http://kabuki.eecs.berkeley.edu/~abo/slides/quals/quals.8.html, 1 page (Apr. 25, 1996).

*Low-voltage, High-Speed, High-Precision Switched-capacitor Circuits: Slide 11 of 25*, from http://kabuki.eecs.berkeley.edu/~abo/slides/quals/quals.11.html, 1 page (Apr. 25, 1996).

Norsworthy, S.R. et al., *Delta-Sigma Data Converters*, IEEE Press, pp. v-xiv and 334-348 (1997).

Copy of European Search Report for Appln. No. EP 02 25 0157, issued Jul. 23, 2003, 3 pages.

\* cited by examiner

- 502 CONNECT A VOLTAGE INPUT SIGNAL TO A FIRST NODE OF A BRIDGE CIRCUIT AND TO THE SWITCHED CAPACITOR CIRCUIT
- 504 REGULATE A GATE VOLTAGE OF A MOSFET RESISTOR DISPOSED IN A RESISTOR BRANCH OF THE BRIDGE CIRCUIT TO CONTROL THE RESISTANCE OF THE MOSFET RESISTOR
- 506 CONNECT THE REGULATED GATE VOLTAGE TO A GATE TERMINAL OF A SIGNAL CONDUCTING MOSFET SWITCH IN THE SWITCHED CAPACITOR CIRCUIT, THEREBY CONTROLLING THE RESISTANCE OF THE SIGNAL CONDUCTING MOSFET SWITCH SO THAT IT IS INDEPENDENT OF THE VOLTAGE INPUT SIGNAL, THEREBY REDUCING TRACK MODE DISTORTION IN THE SWITCHED CAPACITOR CIRCUIT

- 602 CONNECT A NONINVERTING TERMINAL OF AN OPERATIONAL AMPLIFIER TO A SECOND NODE OF THE BRIDGE CIRCUIT AND AN INVERTING TERMINAL OF THE OPERATIONAL AMPLIFIER TO A THIRD NODE OF THE BRIDGE CIRCUIT
- 604 CONNECT AN OUTPUT OF THE OPERATIONAL AMPLIFIER TO A GATE TERMINAL OF A MOSFET RESISTOR DISPOSED IN A RESISTOR BRANCH OF THE BRIDGE CIRCUIT, THEREBY REGULATING THE GATE VOLTAGE OF THE MOSFET RESISTOR TO CONTROL THE RESISTANCE OF THE MOSFET RESISTOR

METHOD AND CIRCUIT FOR CONTROLLING A RESISTANCE OF A FIELD EFFECT TRANSISTOR CONFIGURED TO CONDUCT A SIGNAL WITH A VARYING VOLTAGE

CROSS-REFERENCE TO RELATED APPLICATIONS

This application is a continuation of U.S. application Ser. No. 10/782,978, filed Feb. 23, 2004, now U.S. Pat. No. 6,861,879, which is a division of U.S. patent application Ser. No. 09/911,498, filed Jul. 25, 2001, now U.S. Pat. No. 6,720,799, which claims the benefit of U.S. Provisional Application Ser. No. 60/260,924, filed Jan. 11, 2001.

BACKGROUND OF THE INVENTION

1. Field of the Invention

The present invention relates to a replica network for linearizing switched capacitor circuits.

2. Background Art

Switched capacitor sampling networks are commonly used in signal processing applications. They can be efficiently implemented using CMOS technology and are easily integrated with other networks. Among other functions, switched capacitor sampling networks are used for filtering, sample and hold, analog-to-digital conversion, and digital-to-analog conversion.

High performance switch capacitor sampling networks are typically configured as differential circuits. As compared with single-ended designs, a differential embodiment enjoys improved power supply noise rejection, double the output range, and cancellation of even-order distortion components.

Figure 1A:
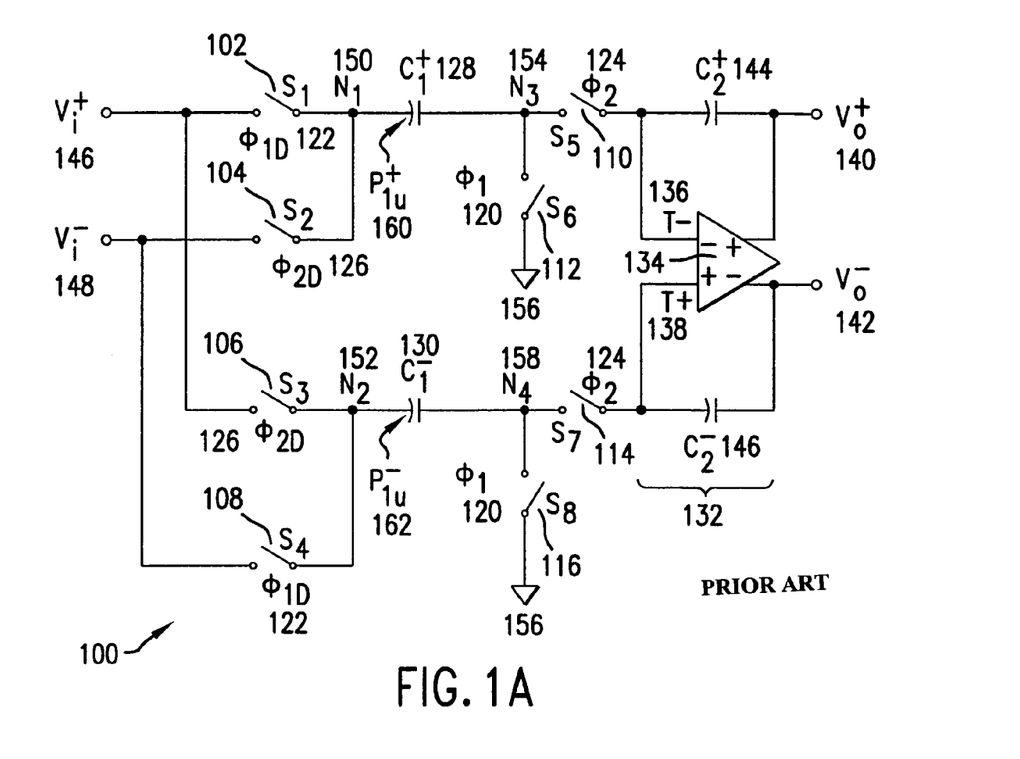
FIG. 1A is a schematic diagram of a typical differential switched capacitor sampling network 100.

FIG. 1A is a schematic diagram of a typical differential switched capacitor sampling network 100. In FIG. 1A, network 100 comprises eight switches: $S_1$ 102, $S_2$ 104, $S_3$ 106, $S_4$ 108, $S_5$ 110, $S_6$ 112, $S_7$ 114, and $S_8$ 116. Collectively, $S_1$ 102, $S_2$ 104, $S_3$ 106, and $S_4$ 108 are referred to as signal conducting switches, while $S_5$ 110, $S_6$ 112, $S_7$ 114, and $S_8$ 116 are collectively referred to as summing junction switches.

Figure 1B:
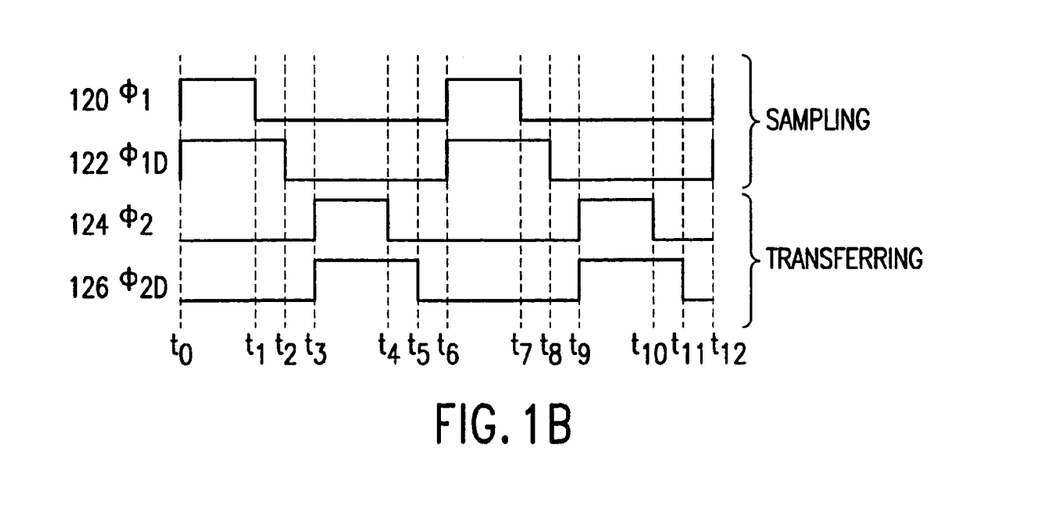
FIG. 1B illustrates a two-phase nonoverlapping clock scheme 118 defined by four clock waveforms.

FIG. 1B illustrates a two-phase nonoverlapping clock scheme 118 defined by four clock waveforms: $\Phi_1$ 120, $\Phi_{1D}$ 122, $\Phi_2$ 124, and $\Phi_{2D}$ 126. The position of each switch at any given time is determined by its corresponding clock waveform. In a representative embodiment, a switch is open when its corresponding clock waveform is "off" and closed when its corresponding clock waveform is "on." One skilled in the art would recognize that network 100 could be configured with other relationships between the state of the switches and their corresponding clock waveforms.

Clock scheme 118 is configured so that $\Phi_1$ 120 and $\Phi_{1D}$ 122 are on when $\Phi_2$ 124 and $\Phi_{2D}$ 126 are off. Clock waveforms $\Phi_{1D}$ 122 and $\Phi_{2D}$ 126 are similar to, respectively, clock waveforms $\Phi_1$ 120 and $\Phi_2$ 124. However, the falling edges of $\Phi_{1D}$ 122 and $\Phi_{2D}$ 126 are not initiated until after $\Phi_1$ 120 and $\Phi_2$ 124 have returned to their "off" states. Together, clock waveforms $\Phi_1$ 120 and $\Phi_{1D}$ 122 define a sampling phase of clock scheme 118 while clock waveforms $\Phi_2$ 124 and $\Phi_{2D}$ 126 define a transferring phase.

Network 100 further comprises a positive voltage sampling capacitor $C_1^+$ 128, a negative voltage sampling capacitor $C_1^-$ 130, and a differential integrator 132. Differential integrator 132 comprises an operational amplifier 134 with an inverting terminal $T^-$ 136, a noninverting terminal $T^+$ 138, a positive voltage output signal $V_o^+$ 140, and a negative voltage output signal $V_o^-$ 142. A positive voltage feedback capacitor $C_2^+$ 144 is connected in parallel with operational amplifier 134 between $T^-$ 136 and $V_o^+$ 140. A negative voltage feedback capacitor $C_2^-$ 146 is connected in parallel with operational amplifier 134 between $T^+$ 138 and $V_o^-$ 142. Both a positive voltage input signal $V_i^+$ 146 and a negative voltage input signal $V_i^-$ 148 are received by network 100.

Switch $S_1$ 102 is disposed between $V_i^+$ 146 and $C_1^+$ 128. Switch $S_2$ 104 is disposed between $V_i^-$ 148 and $C_1^+$ 128, such that $S_1$ 102 and $S_2$ 104 are connected in parallel with each other at a node $N_1$ 150 upstream of $C_1^+$ 128. Switch $S_3$ 106 is disposed between $V_i^+$ 146 and $C_1^-$ 130. Switch $S_4$ 108 is disposed between $V_i^-$ 148 and $C_1^-$ 130, such that $S_3$ 106 and $S_4$ 108 are connected in parallel with each other at a node $N_2$ 152 upstream of $C_1^-$ 130.

Switch $S_5$ 110 is disposed between a node $N_3$ 154 downstream of $C_1^+$ 128 and $T^-$ 136. Switch $S_6$ 112 is disposed between $N_3$ 154 and an analog ground connection 156. Switch $S_7$ 114 is disposed between a node $N_4$ 158 downstream of $C_1^-$ 130 and $T^+$ 138. Switch $S_8$ 116 is disposed between $N_4$ 158 and analog ground connection 156.

Operation of network 100 can be explained by tracing the circuits that are established in response to the cycling of the clock waveforms of clock scheme 118.

At a time $t_0$, clock waveforms $\Phi_1$ 120 and $\Phi_{1D}$ 122 cycle to the on state while clock waveforms $\Phi_2$ 124 and $\Phi_{2D}$ 126 remain in the off state. In response to the on state of $\Phi_1$ 120, switches $S_6$ 112 and $S_8$ 116 close. In response to the on state of $\Phi_{1D}$ 122, switches $S_1$ 102 and $S_4$ 108 close. With $S_1$ 102 and $S_6$ 112 closed, a circuit is established between $V_i^+$ 146 and analog ground 156 through $C_1^+$ 128. This circuit allows $V_i^+$ 146 to be sampled as a charge on an upstream plate $P_{1u}^+$ 160 of $C_1^+$ 128. The value of this charge is equal to the product of the capacitance of $C_1^+$ 128 and the voltage of $V_i^+$ 146. Likewise, with $S_4$ 108 and $S_8$ 116 closed, a circuit is established between $V_i^-$ 148 and analog ground 156 through $C_1^-$ 130. This circuit allows $V_i^-$ 148 to be sampled as a charge on an upstream plate $P_{1u}^-$ 162 of $C_1^-$ 130. The value of this charge is equal to the product of the capacitance of $C_1^-$ 130 and the voltage of $V_i^-$ 148.

At a time $t_1$, clock waveform $\Phi_1$ 120 cycles to the off state, while $\Phi_{1D}$ 122 remains in the on state. Clock waveforms $\Phi_2$ 124 and $\Phi_{2D}$ 126 remain in the off state. In response to the off state of $\Phi_1$ 120, switches $S_6$ 112 and $S_8$ 116 open. Opening switch $S_6$ 112 breaks the circuit between $V_i^+$ 146 and analog ground 156. This isolates the charge stored on upstream plate $P_{1u}^+$ 160, thus effectively sampling $V_i^+$ 146. Likewise, opening switch $S_8$ 116 breaks the circuit between $V_i^-$ 148 and analog ground 156. This isolates the charge stored on upstream plate $P_{1u}^-$ 162, thus effectively sampling $V_i^-$ 148.

At a time $t_2$, clock waveform $\Phi_{1D}$ 122 cycles to the off state. Clock waveforms $\Phi_1$ 120, $\Phi_2$ 124, and $\Phi_{2D}$ 126 remain in the off state. In response to the off state of $\Phi_{1D}$ 122, switches $S_1$ 102 and $S_4$ 108 open. By delaying the opening of switches $S_1$ 102 and $S_4$ 108 until after switches $S_6$ 112 and $S_8$ 116 have been opened, and thus isolating the charges stored on $C_1^+$ 128 and $C_1^-$ 130, the sampled signals are unaffected by the charge injection that occur after switches $S_6$ 112 and $S_8$ 116 have been opened. Particularly, the sampled signals are not distorted by any charge injection resulting from the opening of switches $S_1$ 102 and $S_4$ 108.

At a time $t_3$, clock waveforms $\Phi_2$ 124 and $\Phi_{2D}$ 126 cycle to the on state while clock waveforms $\Phi_1$ 120 and $\Phi_{1D}$ 122 remain in the off state. In response to the on state of $\Phi_2$ 124, switches $S_5$ 110 and $S_7$ 114 close. In response to the on state of $\Phi_{2D}$ 126, switches $S_2$ 104 and $S_3$ 106 close. With $S_2$ 104 and $S_5$ 110 closed, a circuit is established between $V_i^-$ 148 and differential integrator 132 through $C_1^-$ 128. This circuit enables the charge on upstream plate $P_{1u}^+$ 160 to be transferred to differential integrator 132. One skilled in the art would recognize that the transferred charge is defined by Eq. (1):

$$Q=C_s\times[V_i^+-V_i^-],\qquad\text{Eq. (1)}$$

where Cs equals the value of the capacitance of $C_1^+$ 128. As it is desired that the charge transferred to differential integrator 132 equals the charge stored on capacitor $C_1^+$ 128, the use of a differential circuit enables $C_1^+$ 128 to have a smaller value of capacitance than it would have in a single-ended switched capacitor integrator configuration having the same gain and the same value of capacitance for the feedback capacitor. Advantageously, a smaller value for $C_1^+$ 128: (1) increases the speed of network 100, (2) reduces the degradation in bandwidth of frequencies that network 100 can support, and (3) enables the feedback factor of differential integrator 132 to be nearer to unity, where feedback factor is defined by Eq. (2):

$$\text{Feedback Factor}=C_f/[C_f+C_s].\qquad\text{Eq. (2)}$$

Likewise, with $S_3$ 106 and $S_7$ 114 closed, a circuit is established between $V_i^+$ 146 and differential integrator 132 through $C_1^-$ 130. This circuit enables the charge on upstream plate $P_{1u}^-$ 162 to be transferred to differential integrator 132 in the same manner as described above.

At a time $t_4$, clock waveform $\Phi_2$ 124 cycles to the off state, while $\Phi_{2D}$ 126 remains in the on state. Clock waveforms $\Phi_2$ 120 and $\Phi_2$ 122 remain in the off state. In response to the off state of $\Phi_2$ 124, switches $S_5$ 110 and $S_7$ 114 open. Opening switch $S_5$ 110 breaks the circuit between $V_i^-$ 148 and differential integrator 132. This isolates the charge transferred to differential integrator 132 from $C_1^+$ 128. Likewise, opening switch $S_7$ 114 breaks the circuit between $V_i^+$ 146 and differential integrator 132. This isolates the charge transferred to differential integrator 132 from $C_1^-$ 130.

At a time $t_5$, clock waveform $\Phi_{2D}$ 126 cycles to the off state. Clock waveforms $\Phi_1$ 120, $\Phi_2$ 122, and $\Phi_2$ 124 remain in the off state. In response to the off state of $\Phi_{2D}$ 126, switches $S_2$ 104 and $S_3$ 106 open. By delaying the opening of switches $S_2$ 104 and $S_3$ 106 until after switches $S_5$ 110 and $S_7$ 114 have been opened, the transferred signals are unaffected by the charge injection that occur after switches $S_5$ 110 and $S_7$ 114 have been opened. Particularly, the transferred signals are not distorted by any charge injection resulting from the opening of switches $S_2$ 104 and $S_3$ 106.

At a time $t_6$ clock waveforms $\Phi_1$ 120 and $\Phi_{1D}$ 122 cycle to the on state while clock waveforms $\Phi_2$ 124 and $\Phi_{2D}$ 126 remain in the off state. The response of network 100 to the on state of $\Phi_1$ 120 and $\Phi_{1D}$ 122 is identical to the response to the on state at time $t_0$ as explained above. Likewise, at times subsequent to $t_6$, network 100 operates in the manner explained above.

Figure 2:
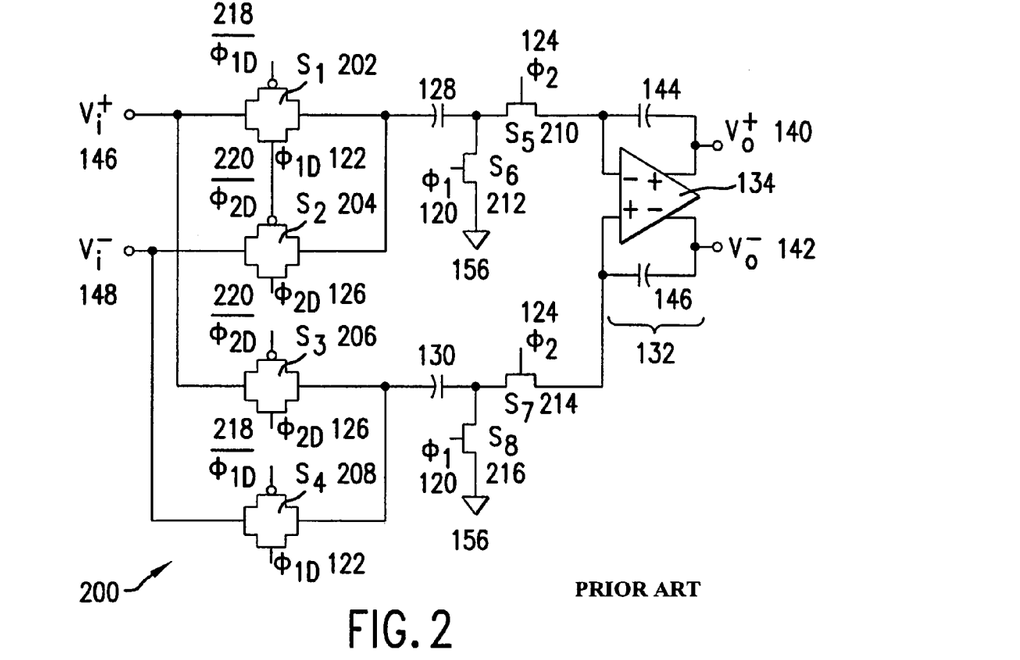
FIG. 2 is a schematic diagram of a differential switched capacitor sampling network 200, with MOSFET switches.

In a more typical embodiment, the switches of FIG. 1A are implemented with MOSFETs. FIG. 2 is a schematic diagram of a differential switched capacitor sampling network 200, with MOSFET switches. This circuit is described in Stephen R. Norsworthy et al., *Delta-Sigma Data Converters: Theory, Design, and Simulation*, The Institute of Electrical and Electronics Engineers, Inc. 1997, which is incorporated herein by reference.

In FIG. 2, signal conducting switches $S_1$ 202, $S_2$ 204, $S_3$ 206, and $S_4$ 208 are implemented with CMOSFETs, while summing junction switches $S_5$ 210, $S_6$ 212, $S_7$ 214, and $S_8$ 216 are implemented with NMOSFETs. However, one skilled in the art would recognize that the type of MOSFETs used to implement the switches would be a function of, among other considerations, the signal environment in which network 200 would operate. The use of CMOSFETs for the signal conducting switches extends the range of voltages over which the signal conducting switches would conduct. The use of CMOSFETs for this particular purpose is well understood in the art.

For each MOSFET switch of FIG. 2, the signal path is between its source and drain terminals. The state of the MOSFET switch is controlled by a clock waveform applied to its gate terminal. For the PMOSFET portion of a CMOSFET, the clock waveform is opposite of the clock waveform used for the NMOSFET portion. Thus, a clock waveform ($\Phi_{1D}$ [bar] 218 is in the on state when clock waveform ($\Phi_{1D}$ 122 is in the off state and vice versa. Likewise, a clock waveform $\Phi_{2D}$ [bar] 220 is in the on state when clock waveform $\Phi_{2D}$ 126 is in the off state and vice versa.

While delaying the opening of the signal conducting switches until after the summing junction switches have been opened isolates the sampled signal from distortions due to charge injections from the signal conducting switches, this clock scheme does not protect the sampled signal from distortions due to: (1) variations in the resistances of the signal conducting switches that operate in an environment of a varying voltage signal, or (2) charge injections from the summing junction switches.

Where a switch in a differential switched capacitor sampling network is implemented as a MOSFET, the resistance of the switch is defined by Eq. (3):

$$R=1/[k\times(V_{GS}-V_T-V_{DS})],\qquad\text{Eq.(3)}$$

where k is a constant, $V_{GS}$ is the voltage potential between the gate and source terminals, $V_T$ is the threshold voltage, and $V_{DS}$ is the voltage potential between the drain and source terminals of the MOSFET. These parameters are well understood in the art.

Applying Eq. (3) to a signal conducting MOSFET switch of FIG. 2, the skilled artisan will appreciate that when the signal conducting MOSFET switch (e.g., $S_1$ 202, $S_2$ 204, $S_3$ 206, or $S_4$ 208) is on, a signal with a varying voltage is applied to the source terminal, while a constant voltage (i.e., the clock) is applied to the gate terminal. This produces a voltage $V_{GS}$ that varies in a signal dependent manner. This, in turn, results in the MOSFET switch having a resistance R whose value is signal dependent. As resistance R of the MOSFET switch varies, the drop in the voltage potential of the signal across the switch also changes. Changes in this drop in voltage distort the voltage potential of the signal that is sampled by a sampling capacitor. The distortion is signal dependent. This phenomenon is referred to as track mode distortion.

Meanwhile, delaying the opening of a signal conducting switch during the transferring phase (e.g., $S_2$ 204 or $S_3$ 206) until after its corresponding summing junction switch connected to the differential integrator (e.g., $S_5$ 210 or $S_7$ 214) has been opened exposes the transferred signal to distortions from charge injections from the summing junction switch connected to the differential integrator. Specifically, as the summing junction switch connected to the differential integrator is opened, a residual charge retained on it will have two paths through which to dissipate: (1) from the summing junction switch, through the sampling capacitor and the signal conducting switch, and towards the signal, and (2) from the summing junction switch towards the differential integrator.

The total residual charge will divide between these two paths according to the resistance that each path presents. From FIGS. 1A, 1B, and 2, it can be observed that at $t_4$ the signal conducting MOSFET switch (e.g., $S_2$ 202 or $S_3$ 206) is closed while the summing junction MOSFET switch (e.g., $S_5$ 210 or $S_7$ 214) is being opened. As explained above, the resistance R of the closed signal conducting MOSFET switch is signal dependent. Therefore, the amount of the total residual charge that dissipates through the closed signal conducting MOSFET switch will also be signal dependent. Because the amount of the total residual charge that dissipates towards the differential integrator is the difference between the total residual charge and the amount of the total residual charge that dissipates through the closed signal conducting MOSFET switch, the amount of the total residual charge that dissipates towards the differential integrator will also be signal dependent and distort the signal transferred to the differential integrator.

Previous efforts to correct for signal dependent distortion in differential switched capacitor sampling networks have used midrange threshold voltage (about 0.3 volts) MOSFET switches. Differential switched capacitor sampling networks using these devices have been shown to reduce distortion. However, fabrication of these MOSFET switches requires the use of expensive extra mask layers. Also, at larger voltage input signal amplitudes and at higher voltage input signal frequencies, this approach has been shown to be ineffective at reducing signal distortion.

Figure 3:
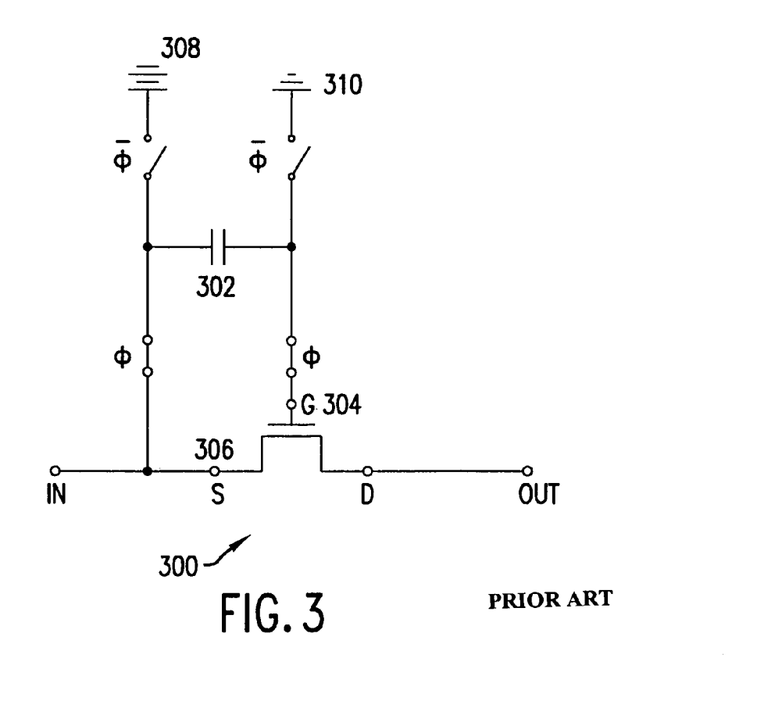
FIG. 3 is a schematic diagram of a signal conducting MOSFET switch 300 with a bootstrap capacitor 302 connected between a gate terminal 304 and a source terminal 306.

Alternatively, bootstrap capacitors have been used to buffer against changes in voltage between the gate and source terminals of signal conducting MOSFET switches. FIG. 3 is a schematic diagram of a signal conducting MOSFET switch 300 with a bootstrap capacitor 302 connected between a gate terminal 304 and a source terminal 306. During the on state of the clock waveform, bootstrap capacitor 302 acts to maintain $V_{GS}$ at a relatively constant voltage. As can be seen by applying Eq. (3), this mitigates the variation in the resistance R of signal conducting MOSFET switch 300 and thus reduces the degree of signal dependent distortion. During the off state of the clock waveform, bootstrap capacitor 302 is connected between a voltage source 308 and ground 310. This is done so that bootstrap capacitor 302 can be charged by voltage source 308 to enable it to perform its function during the on state of the clock waveform.

While the use of bootstrap capacitors has proven to be an adequate solution in many applications, it does present several disadvantages. Specifically, the bootstrap capacitors must be relatively large (on an order of magnitude that is four to five times the capacitance between the gate and source terminals of the signal conducting MOSFET switches) and they consume a relatively large amount of power. Furthermore, of the three parameters that determine the resistance R of the signal conducting MOSFET switches—$V_{GS}$, $V_T$, and $V_{DS}$ 00 the use of bootstrap capacitors essentially addresses only one of these factors: $V_{GS}$. This limits the accuracy of this solution for use in high precision applications. What is needed is a mechanism that controls the resistance R of a signal conducting MOSFET switch so that the resistance R is independent of the signal voltage and the switched capacitor circuit is linearized.

BRIEF SUMMARY OF THE INVENTION

The present invention relates to a replica network for linearizing switched capacitor circuits. A bridge circuit with a MOSFET resistor disposed in a resistor branch of the bridge circuit is provided. A noninverting terminal of an operational amplifier is connected to a first node of the bridge circuit and an inverting terminal of the operational amplifier is connected to a second node of the bridge circuit. The second node is separated from the first node by a third node of the bridge circuit. An output of the operational amplifier is provided to a gate terminal of the MOSFET resistor and to the gate terminal of the MOSFET switch, thereby controlling the voltage to the gate terminal of the MOSFET switch.

In an embodiment, a compensation capacitor is connected in parallel between the output and the second node. In another embodiment, an analog ground is connected to a third node of the bridge circuit. In yet another embodiment, a voltage input signal is connected to a fourth node of the bridge circuit.

Preferably, the resistance of a first resistor connected between the first node and the third node equals the resistance of a second resistor connected between the second node and the third node. Preferably, the MOSFET resistor is connected between the second node and the fourth node. Preferably, the resistance of a third resistor connected between the first node and the fourth node is smaller than the resistance of the first resistor or the second resistor.

In an embodiment, the output of the operational amplifier controls the resistance of the MOSFET resistor so that the resistance of the MOSFET resistor equals the resistance of the third resistor. In another embodiment, the output of the operational amplifier controls the resistance of the MOSFET switch so that the resistance of the MOSFET switch equals the resistance of the third resistor. Preferably, the MOSFET resistor is similar to (i.e., the same type and/or size) the MOSFET switch. Preferably, the MOSFET resistor has a threshold voltage less than or equal to zero volts. Advantageously, MOSFETs with threshold voltages at this level are inexpensive to fabricate. In an embodiment, the MOSFET resistor is a native NMOSFET device.

In an embodiment, a first switch is disposed within the connection between the output and the gate terminal of the MOSFET switch. In a related embodiment, the first switch cycles to an open state and a closed state in response to an on state and an off state of a first clock waveform. In another related embodiment, a second switch is connected between a fifth node and analog ground. The fifth node is disposed within the connection between the first switch and the gate terminal of the MOSFET switch. In yet another related embodiment, the second switch cycles to an open state and a closed state in response to an on state and an off state of a second clock waveform.

In an embodiment, the replica network comprises two replica networks. In a related embodiment, each replica network receives a voltage input signal from a differential circuit. In another related embodiment, the differential circuit is a differential switched capacitor sampling network.

Unlike the use of a bootstrap capacitor, which acts to maintain $V_{GS}$ of a MOSFET switch at a relatively constant voltage and thus mitigates the variation in the resistance of the MOSFET switch, the replica network of the present invention acts to vary $V_{GS}$ as necessary to peg the resistances R of the MOSFET switch to the fixed resistance value of resistor in the bridge circuit.

In this manner, the replica network of the present invention provides a mechanism that controls the resistance of the MOSFET switch so that it is independent of the signal voltage. For a differential switched capacitor sampling network, this mitigates signal dependent distortion due to charge injection from the summing junction switches during the transferring phase and eliminates track mode distortion due to variations in the resistances of the signal conducting MOSFET switches during the sampling phase. Thus, the replica network of the present invention linearizes the switched capacitor circuit.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

The preferred embodiments of the invention are described with reference to the figures where like reference numbers indicate identical or functionally similar elements. Also in the figures, the left most digit of each reference number identifies the figure in which the reference number is first used.

DETAILED DESCRIPTION OF THE INVENTION

Figure 4:
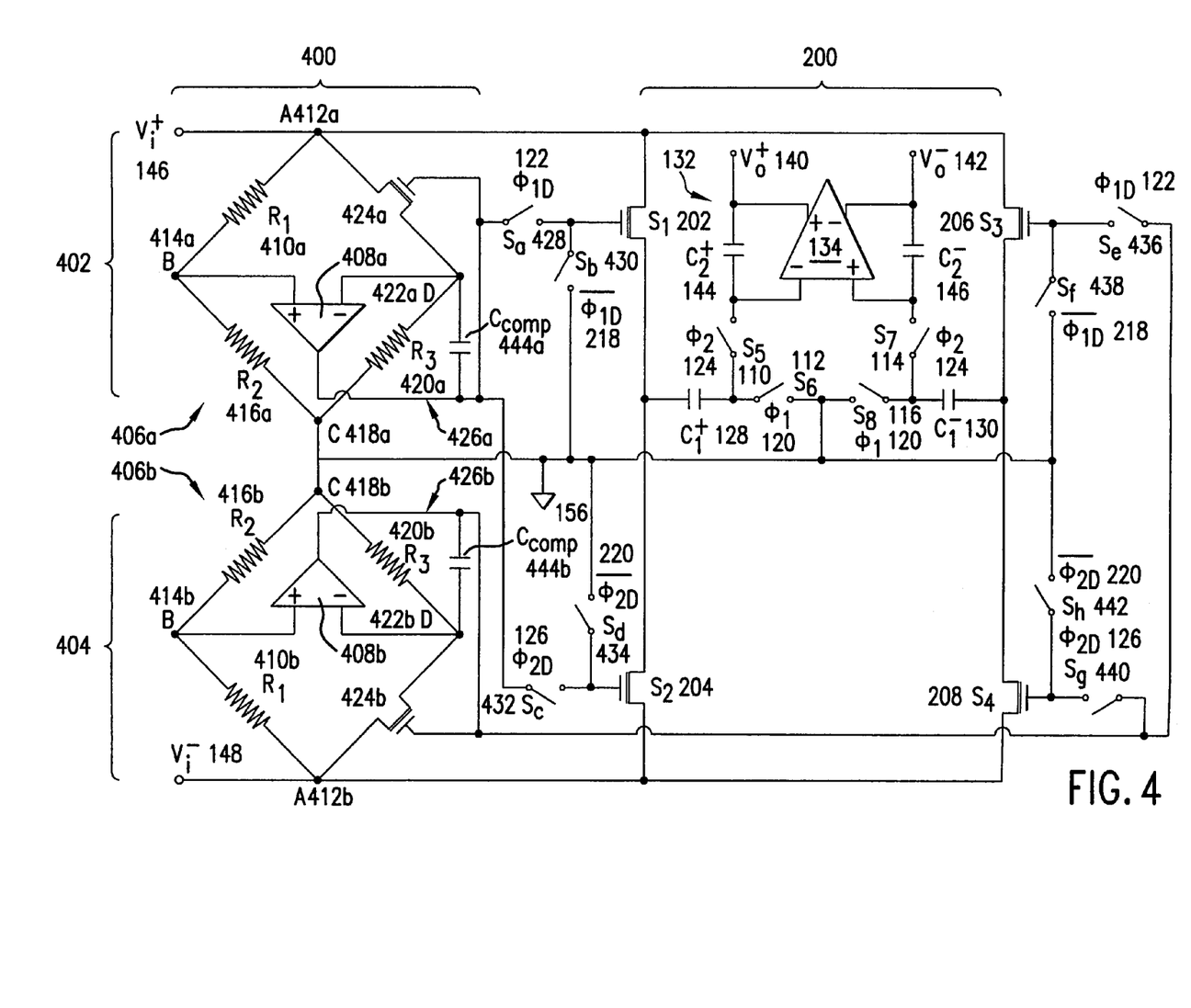
FIG. 4 is a schematic diagram of a replica network 400 that adjusts the clock voltage to the gate terminal of each signal conducting MOSFET switch so that the resistance R is independent of the signal voltage.

The present invention relates to a replica network for linearizing switched capacitor circuits. FIG. 4 is a schematic diagram of a replica network 400 that adjusts the clock voltage to the gate terminal of each signal conducting MOSFET switch so that the resistance R is independent of the signal voltage. Replica network 400 comprises a positive voltage input signal network 402, which receives positive voltage input signal $V_i^+$ 146, and a negative voltage input signal network 404, which receives negative voltage input signal $V_i^-$ 148. Each voltage input signal network 402, 404 comprises a bridge circuit 406 and an operational amplifier 408.

Each bridge circuit 406 comprises four resistance branches connected between four nodes. A resistor $R_1$ 410 is connected between a node A 412 and a node B 414. A resistor $R_2$ 416 is connected between node B 414 and a node C 418. A resistor $R_3$ 420 is connected between node C 418 and a node D 422. A MOSFET resistor 424 is connected between node D 422 and node A 412. Resistors $R_2$ 416 and $R_3$ 420 have the same value of resistance. Preferably, the resistance value of resistors $R_2$ 416 and $R_3$ 420 is larger than the resistance value of resistor $R_1$ 410. In an embodiment, MOSFET resistor 424 has a threshold voltage less than or equal to zero volts. Advantageously, MOSFETs with threshold voltages at this level are inexpensive to fabricate. Furthermore, MOSFET resistor 424 should be similar to (i.e., the same type and/or size) the signal conducting MOSFET switches shown in FIG. 2. MOSFET resistor 424 could be, but is not limited to, a CMOSFET, a NMOSFET, or a PMOSFET, as would be understood by one skilled in the art. Particularly, MOSFET resistor 424 could be a native NMOSFET device. FIG. 4 shows replica network 400 with a native NMOSFET device used for MOSFET resistor 424 and also reproduces differential switched capacitor sampling network of FIGS. 1A and 2 with native NMOSFET devices used for the signal conducting switches.

In FIG. 4, in a representative embodiment, node A 412 receives a voltage input signal, node B 414 is connected to the noninverting terminal of operational amplifier 408, node C 418 is connected to analog ground 156, and node D 422 is connected to the inverting terminal of operational amplifier 408. One skilled in the art would recognize other configurations by which the voltage input signal and operational amplifier could be connected to the nodes of bridge circuit 406 in the manner of the present invention. Therefore, the present invention is not limited to the configuration shown in FIG. 4.

Each operational amplifier 408, at its output terminal, produces an output voltage 426 that is used as the clock voltage for its respective signal conducting MOSFET switches (e.g., $S_1$ 202, $S_2$ 204, $S_3$ 206, or $S_4$ 208). Output voltage 426a from positive voltage input signal network 402 is used as the clock voltages for signal conducting MOSFET switches $S_1$ 202 and $S_2$ 204, while output voltage 426b from negative voltage input signal network 404 is used as the clock voltages for signal conducting MOSFET switches $S_3$ 206 and $S_4$ 208.

While output voltages 426 determine the values of the clock voltages, the shape of the clock waveforms are determined by switches $S_a$ 428, $S_b$ 430, $S_c$ 432, $S_d$ 434, $S_e$ 436, $S_f$ 438, $S_g$ 440, and $S_h$ 442. In an embodiment, these switches are implemented as MOSFET switches. These are appropriately sized (i.e., much smaller than the signal conducting MOSFET switches) to reduce the second order effect of clock feedthrough onto the sampling capacitors (e.g., $C_1^+$ 128 and $C_1^-$ 130).

For signal conducting MOSFET switch $S_1$ 202, the shape of the clock waveform applied to its gate terminal is controlled by switch $S_a$ 428. Switch $S_a$ 428 cycles open and closed in response, respectively, to the off and on states of clock waveform $\Phi_{1D}$ 122. With switch $S_a$ 428 closed, a circuit is established between operational amplifier 408 and the gate terminal of switch $S_1$ 202. When switch $S_a$ 428 opens, switch $S_b$ 430 closes. Switch $S_b$ 430 cycles open and closed in response, respectively, to the off and on states of clock waveform $\Phi_{1D}$ [bar] 218. With switch $S_b$ 430 closed, a circuit is established between the gate terminal of switch $S_1$ 202 and analog ground 156. This enables any residual charge on the gate terminal of switch $S_1$ 202 to dissipate to analog ground 156 so that switch $S_1$ 202 opens in a timely manner.

In a similar manner, switch $S_c$ 432 controls the shape of the clock waveform applied to the gate terminal of signal conducting MOSFET switch $S_2$ 204. Switch $S_c$ 432 cycles open and closed in response, respectively, to the off and on states of clock waveform $\Phi_{2D}$ 126. Switch $S_d$ 434 dissipates any residual charge on the gate terminal of switch $S_2$ 204 to analog ground 156. Switch $S_d$ 434 cycles open and closed in response, respectively, to the off and on states of clock waveform $\Phi_{2D}$ [bar] 220.

Likewise, switch $S_e$ 436 controls the shape of the clock waveform applied to the gate terminal of signal conducting MOSFET switch $S_3$ 206. Switch $S_e$ 436 cycles open and closed in response, respectively, to the off and on states of clock waveform $\Phi_{1D}$ 122. Switch $S_f$ 438 dissipates any residual charge on the gate terminal of switch $S_3$ 206 to analog ground 156. Switch $S_f$ 438 cycles open and closed in response, respectively, to the off and on states of clock waveform $\Phi_{1D}$ [bar] 218.

Finally, switch $S_g$ 440 controls the shape of the clock waveform applied to the gate terminal of signal conducting MOSFET switch $S_4$ 208. Switch $S_g$ 440 cycles open and closed in response, respectively, to the off and on states of clock waveform $\Phi_{2D}$ 126. Switch $S_h$ 442 dissipates any residual charge on the gate terminal of switch $S_4$ 208 to analog ground 156. Switch $S_h$ 442 cycles open and closed in response, respectively, to the off and on states of clock waveform $\Phi_{2D}$ [bar] 220.

Each voltage input signal network 402, 404 receives its respective voltage input signal (i.e., $V_i^+$ 146 or $V_i^-$ 148) at node A 412. Variation in the voltage input signal causes the resistance R of MOSFET resistor 424 to vary in the manner described above. This, in turn, causes the voltage measurements at node B 414 and node D 422 to be unequal. Operational amplifier 408 responds to these unequal inputs to change output voltage 426. Output voltage 426 is proportional to the difference between the voltage of node B 414 and the voltage of node D 422. Output voltage 426 is applied as feedback to the gate terminal of MOSFET resistor 424, thus changing the value of $V_G$ of MOSFET resistor 424. The feedback network is designed to maintain the resistance R of MOSFET resistor 424 equal to the value of resistor $R_1$ 410, so that bridge circuit 406 remains in balance. Thus, the feedback network is designed so that changes to the value of $V_G$ cause, through application of Eq. (3), appropriate changes to the value of $V_{GS}$ so that the resistance R of MOSFET resistor 424 is maintained equal to the value of resistor $R_1$ 410.

In an embodiment, a compensation capacitor $C_{comp}$ 444 is connected in parallel between node D 422 and the output of operational amplifier 408. Compensation capacitor $C_{comp}$ 444 is a feedforward shunt capacitor that improves the stability of the feedback network between operational amplifier 408 and bridge circuit 406. One skilled in the art will understand that the feedback network has a process and temperature dependent feedback factor due to the transconductance of the triode region of MOSFET resistor 424. The process and temperature dependent feedback factor changes the effective bandwidth of the feedback network with respect to process and operating temperature. This degrades the gain of the feedback network. The phase margin, and therefore the stability, of the feedback network is also effected by the process and operating temperature. Compensation capacitor $C_{comp}$ 444 provides lead compensation and ensures sufficient phase margin over process variations.

In an embodiment, operational amplifier 408 has a folded cascode topology to support a large bandwidth and high gain in the presence of low feedback factors. Operational amplifier 408 needs to maintain sufficient feedback network gain at high frequencies. There is a direct relation between the amount of linearization that can be obtained and the amount of power consumed. Greater bandwidth in the feedback network can be obtained at a cost of additional power dissipation.

Where MOSFET resistor 424 is maintained sufficiently in triode, with $V_{DS}$ less than the difference between $V_{GS}$ and $V_T$, the resistance R of MOSFET switches $S_1$ 202, $S_2$ 204, $S_3$ 206, and $S_4$ 208 will track the value of resistor $R_1$ 410. Preferably, MOSFET resistor 424 has a threshold voltage less than or equal to zero volts.

As noted above, MOSFET resistor 424 should be similar to (i.e., the same type and/or size) as the signal conducting MOSFET switches whose clock voltages MOSFET resistor 424 regulates. So, for positive voltage input signal network 402, MOSFET resistor 424a should be similar to (i.e., the same type and/or size) as signal conducting MOSFET switches $S_1$ 202 and $S_2$ 204, while for negative voltage input signal network 404, MOSFET resistor 424b should be similar to (i.e., the same type and/or size) as signal conducting MOSFET switches $S_3$ 206 and $S_4$ 208.

As can be observed in FIG. 4, because: (1) the signal conducting MOSFET switches (i.e., $S_1$ 202, $S_2$ 204, $S_3$ 206, and $S_4$ 204) are similar to (i.e., the same type and/or size) their corresponding MOSFET resistors 424, (2) identical voltage values are applied to the gate terminals of the signal conducting MOSFET switches and their corresponding MOSFET resistors 424, and (3) the same voltage input signals (i.e., $V_i^+$ 146 and $V_i^-$ 148) are applied to both the differential switched capacitor sampling network and replica network 400, the resistances R of the signal conducting MOSFET switches will also be held to values near the value of resistor $R_1$ 410.

Unlike the use of bootstrap capacitors, which act to maintain $V_{GS}$ at a relatively constant voltage and thus mitigate the variation in the resistances R of the signal conducting MOSFET switches, replica network 400 acts to vary $V_{GS}$ only as much as necessary to peg the resistances R of the signal conducting MOSFET switches $S_1$ 202, $S_2$ 204, $S_3$ 206, and $S_4$ 204 to the fixed resistance value of resistor $R_1$ 410 in response to the changes in threshold voltage of MOSFET resistor 424 with respect to varying input signal voltages. In this manner, replica network 400 provides a mechanism that controls the resistances R of the signal conducting MOSFET switches so that they are independent of the signal voltage. This, in turn: (1) mitigates signal dependent distortion due to charge injection from the summing junction switches (e.g., $S_5$ 110 and $S_7$ 114) during the transferring phase and (2) eliminates track mode distortion due to variations in resistance R of the signal conducting MOSFET switches (e.g., $S_1$ 202 and $S_4$ 208) during the sampling phase. Thus, the switched capacitor circuit is linearized.

Although replica network 400 has been described above for use in maintaining the resistances R of signal conducting MOSFET switches in a differential switched capacitor sampling network application, one skilled in the art will recognize other applications for replica network 400. These include, but are not limited to, sample and hold amplifiers, pipelined analog-to-digital converters, folding analog-to-digital converters, and other analog-to-digital converters. In its most general application, the present invention can support any MOSFET switch. Therefore, the present invention should not be limited to differential switched capacitor sampling network applications.

Figure 5:
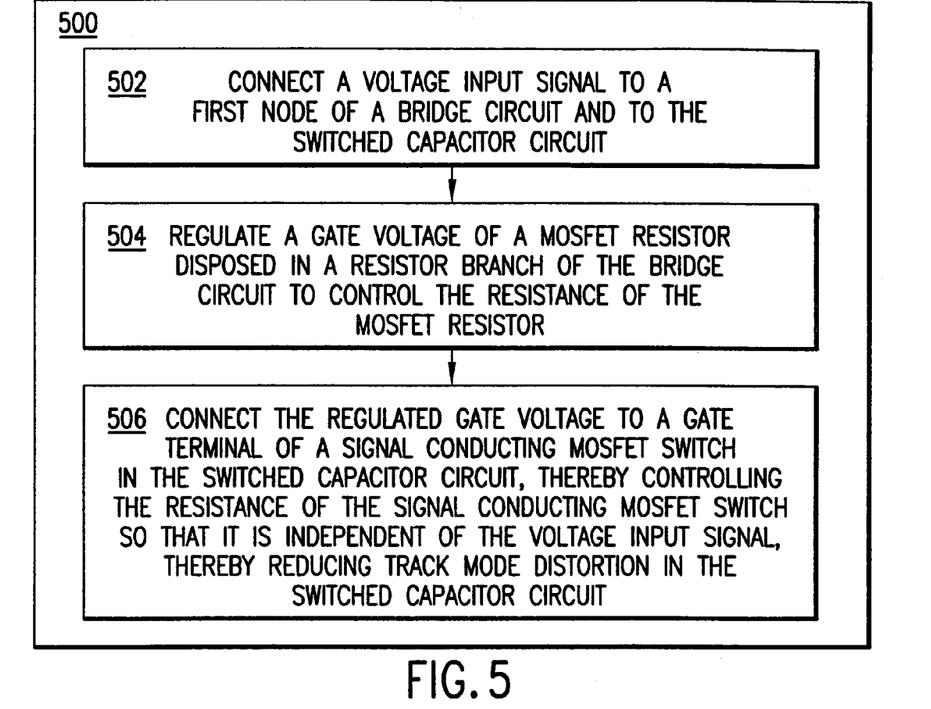
FIG. 5 shows a flow chart of a method 500 for reducing track mode distortion in a switched capacitor circuit.

FIG. 5 shows a flow chart of a method 500 for reducing track mode distortion in a switched capacitor circuit. One skilled in the art will recognize that there are several means by which the steps of method 500 can be realized.

Figure 6:
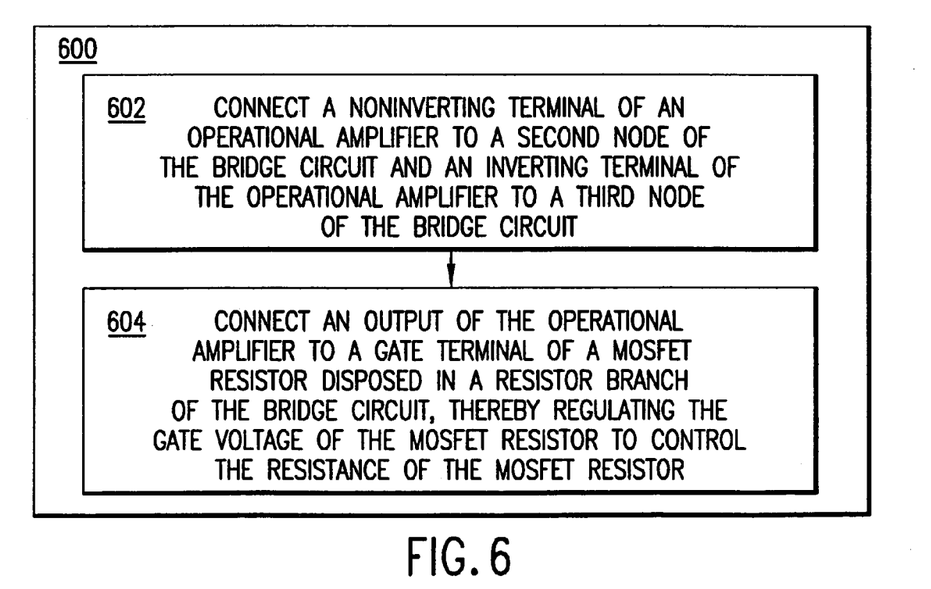
FIG. 6 shows a flow chart of a method 600 of regulating the gate voltage of a MOSFET resistor disposed in a resistor branch of the bridge circuit.

In method 500, at a step 502, a voltage input signal is connected to a first node of a bridge circuit (e.g., 400) and to the switched capacitor circuit (e.g., 200). At a step 504, a gate voltage of a MOSFET resistor (e.g., 424) disposed in a resistor branch of the bridge circuit is regulated to control the resistance of the MOSFET resistor. Further to explain step 504, FIG. 6 shows a flow chart of a method 600 of regulating the gate voltage of a MOSFET resistor disposed in a resistor branch of the bridge circuit.

In method 600, at a step 602, a noninverting terminal of an operational amplifier (e.g., 408) is connected to a second node of the bridge circuit and an inverting terminal of the operational amplifier is connected to a third node of the bridge circuit. The third node is separated from the second node by the first node of the bridge circuit. At a step 604, an output of the operational amplifier is connected to a gate terminal of the MOSFET resistor, thereby regulating the gate voltage of the MOSFET resistor disposed in the resistance branch of the bridge circuit to control the resistance of the MOSFET resistor. Preferably, a compensation capacitor is connected in parallel between the output of the operational amplifier and the third node.

Preferably, the MOSFET resistor is connected between the first node and the third node. In a related embodiment, the output of the operational amplifier controls the resistance of the MOSFET resistor so that the resistance of the MOSFET resistor equals the resistance of a resistor connected between the first node and the second node.

Returning to FIG. 5, in method 500, at a step 506, the regulated gate voltage is connected to a gate terminal of a signal conducting MOSFET switch (e.g., 202, 204, 206, or 208) in the switched capacitor circuit, thereby controlling the resistance of the signal conducting MOSFET switch so that it is independent of the voltage input signal, thereby reducing the track mode distortion in the switched capacitor circuit. Preferably, the MOSFET resistor is similar to (i.e., the same type and/or size) the signal conducting MOSFET switch.

In an embodiment in which the gate voltage of a MOSFET resistor is regulated as prescribed by method 600, preferably, the output of the operational amplifier controls the resistance of the signal conducting MOSFET switch so that the resistance of the signal conducting MOSFET switch equals the resistance of a resistor connected between the first node and the second node.

Alternatively, method 500 can be used to reduce signal distortion due to charge injection from a summing junction switch in a switched capacitor circuit.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A circuit for controlling a resistance of a field effect transistor conducting a signal with a varying voltage, comprising:
   a bridge circuit having a first node and a second node, the bridge circuit configured to have the signal with the varying voltage applied to the first node;
   a first portion of the circuit for tracking a variation in a voltage potential between the first node and the second node; and
   a second portion of the circuit for changing, in response to the variation, a voltage applied to a gate of the first field effect transistor to control the resistance of the field effect transistor;
   wherein the field effect transistor is disposed outside the bridge circuit.

2. The circuit of claim 1, further comprising:
   a third portion of the circuit for determining the voltage applied to the gate of the field effect transistor from the variation in the voltage potential between the first node and the second node.

3. The circuit of claim 1, wherein the variation in the voltage potential between the first node and the second node is proportional to a variation in a voltage potential between a source and a drain of the field effect transistor.

4. The circuit of claim 1, wherein the variation in the voltage potential between the first node and the second node is inversely proportional to the voltage applied to the gate of the field effect transistor.

5. A method for controlling a resistance of a field effect transistor conducting a signal with a varying voltage, comprising the steps of:
   (1) applying the signal with the varying voltage to a bridge circuit;
   (2) tracking a variation in a voltage potential between a first node and a second node of the bridge circuit; and
   (3) changing, in response to the variation, a voltage applied to a gate of the field effect transistor to control the resistance of the field effect transistor;
   wherein the field effect transistor is disposed outside the bridge circuit.

6. The method of claim 5, further comprising:
   (4) determining the voltage applied to the gate of the field effect transistor from the variation in the voltage potential between the first node and the second node.

7. The method of claim 5, wherein the variation in the voltage potential between the first node and the second node is proportional to a variation in a voltage potential between a source and a drain of the field effect transistor.

8. The method of claim 5, wherein the variation in the voltage potential between the first node and the second node is inversely proportional to the voltage applied to the gate of the field effect transistor.

9. A method for controlling a resistance of a first field effect transistor conducting a signal with a varying voltage, comprising the steps of:
   (1) applying the signal with the varying voltage to a second field effect transistor;
   (2) tracking a variation in a voltage potential between a source and a drain of the second field effect transistor; and
   (3) changing, in response to the variation, a first voltage applied to a gate of the first field effect transistor to control the resistance of the first field effect transistor conducting the signal with the varying voltage.

10. The method of claim 9, further comprising:
    (4) changing, in response to the variation, a second voltage applied to a gate of the second field effect transistor to control a resistance of the second field effect transistor.

11. The method of claim 10, wherein the resistance of the second field effect transistor is proportional to the resistance of the first field effect transistor.

12. The method of claim 11, wherein the resistance of the second field effect transistor is equal to the resistance of the first field effect transistor.

13. The method of claim 10, wherein the second voltage is proportional to the first voltage.

14. The method of claim 13, wherein the second voltage is equal to the first voltage.

15. A circuit for controlling a resistance of a first field effect transistor configured to conduct a signal with a varying voltage, comprising:
- a second field effect transistor having a source and a drain, the second field effect transistor configured to have the signal with the varying voltage applied to one of the source and the drain;
- a first portion of the circuit for tracking a variation in a voltage potential between the source and the drain of the second field effect transistor; and
- a second portion of the circuit for changing, in response to the variation, a first voltage applied to a gate of the first field effect transistor to control the resistance of the first field effect transistor configured to conduct the signal with the varying voltage.

16. The circuit of claim 15, further comprising:
- a third of the circuit for changing, in response to the variation a second voltage applied to a gate of the second field effect transistor to control a resistance of the second field effect transistor.

17. The circuit of claim 16, wherein the third portion of the circuit is the second portion of the circuit.

18. The circuit of claim 16, wherein the resistance of the second field effect transistor is proportional to the resistance of the first field effect transistor.

19. The circuit of claim 18, wherein the resistance of the second field effect transistor is equal to the resistance of the first field effect transistor.

20. The circuit of claim 16, wherein the second voltage is proportional to the first voltage.

21. The circuit of claim 20, wherein the second voltage is equal to the first voltage.

* * * * *